(12) United States Patent
deVilliers

(10) Patent No.: US 9,921,478 B2
(45) Date of Patent: Mar. 20, 2018

(54) NEGATIVE TONE DEVELOPER COMPATIBLE PHOTORESIST COMPOSITION AND METHODS OF USE

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/751,757

(22) Filed: Jun. 26, 2015

(65) Prior Publication Data
US 2016/0011516 A1    Jan. 14, 2016

Related U.S. Application Data

(60) Provisional application No. 62/021,756, filed on Jul. 8, 2014.

(51) Int. Cl.
| | | |
|---|---|---|
| *G03F 7/039* | (2006.01) |
| *G03F 7/16* | (2006.01) |
| *G03F 7/20* | (2006.01) |
| *G03F 7/32* | (2006.01) |
| *G03F 7/09* | (2006.01) |
| *G03F 7/40* | (2006.01) |

(52) U.S. Cl.
CPC ............ *G03F 7/039* (2013.01); *G03F 7/0392* (2013.01); *G03F 7/094* (2013.01); *G03F 7/16* (2013.01); *G03F 7/20* (2013.01); *G03F 7/32* (2013.01); *G03F 7/405* (2013.01)

(58) Field of Classification Search
CPC ..... G03F 7/405; G03F 7/0392; H01L 21/0337
USPC .................................................. 430/323, 324
See application file for complete search history.

(56) References Cited

U.S. PATENT DOCUMENTS

| | | | | |
|---|---|---|---|---|
| 5,258,257 A * | 11/1993 | Sinta ..................... | G03F 7/0045 |
| | | | 430/18 |
| 6,503,693 B1 * | 1/2003 | Mohondro .............. | G03F 7/405 |
| | | | 216/49 |
| 2008/0199805 A1 | 8/2008 | Rushkin et al. | |
| 2010/0130016 A1 * | 5/2010 | DeVilliers ........... | H01L 21/0273 |
| | | | 438/703 |
| 2010/0136784 A1 * | 6/2010 | Mebarki ............. | H01L 21/0337 |
| | | | 438/669 |
| 2011/0045413 A1 | 2/2011 | Tsubaki | |
| 2013/0115559 A1 | 5/2013 | Bae et al. | |
| 2013/0171429 A1 | 7/2013 | Liu et al. | |
| 2013/0260311 A1 | 10/2013 | Chang | |

FOREIGN PATENT DOCUMENTS

| | | |
|---|---|---|
| TW | 200929361 | 7/2009 |
| TW | 200935496 | 8/2009 |
| TW | 201113642 | 4/2011 |

OTHER PUBLICATIONS

Taiwanese Patent Application No. 104121954, "Notification of Examination Opinion," Taiwanese filing date Jul. 7, 2015, Notification of Examination Opinion dated Jul. 29, 2016.
International Patent Application No. PCT/US2015/037588, "International Search Report and Written Opinion," dated Sep. 2, 2015, International Filing Date Jun. 25, 2015.

* cited by examiner

*Primary Examiner* — Daborah Chacko-Davis

(57) ABSTRACT

Compositions and methods herein include negative tone developer compatible photoresist compositions and methods of using such compositions. This includes a positive tone photoresist that can be developed using negative tone developers in that unexposed portions of the positive tone photoresist are dissolvable by one or more negative tone developer solvents. One embodiment includes a negative tone developer compatible photoresist with little or no etch resistance. Non-resistive photoresist materials as described herein can include one or more radiation-sensitive attributes (for example, the photoresist can be patterned, de-protected, solubility shifted, interact with photo chemistries, and respond to exposure doses), except that these materials have effectively no etch resistance. Such compositions can be effectively free from components, functional groups, or additives that provide or increase etch resistivity to a wet or dry etch process.

12 Claims, 7 Drawing Sheets

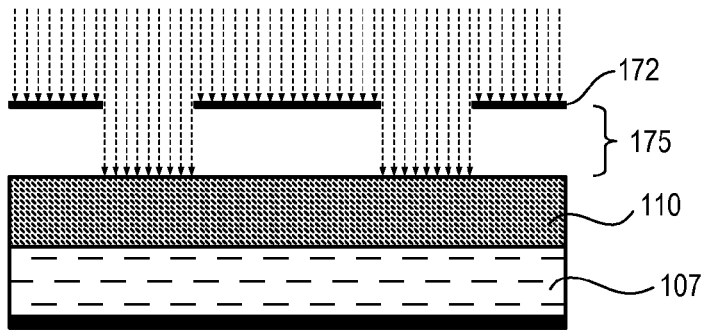
*FIG. 3A*
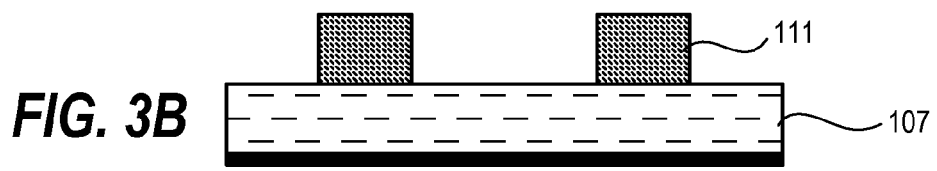
*FIG. 3B*
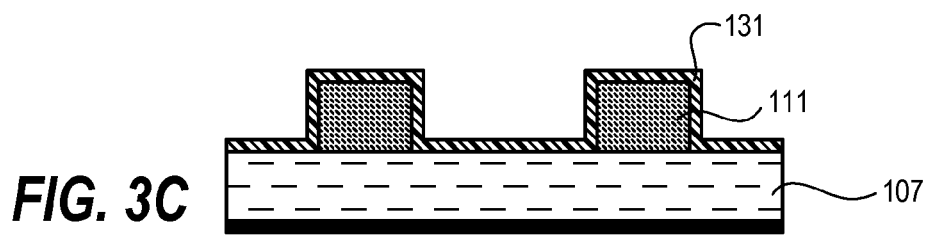
*FIG. 3C*
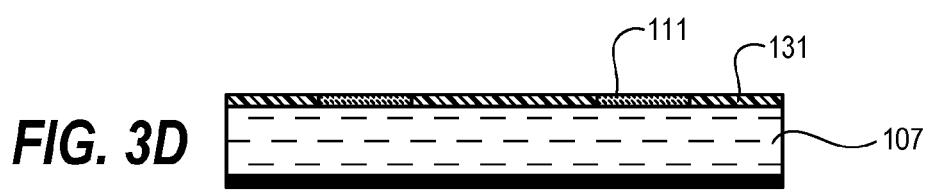
*FIG. 3D*
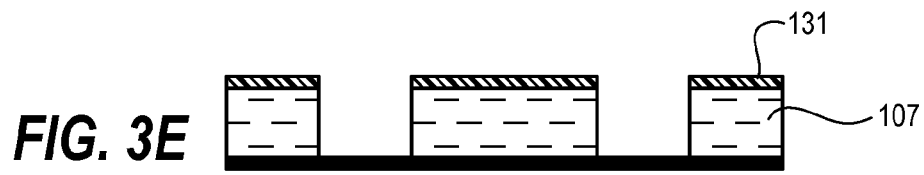
*FIG. 3E*
*FIG. 3*

NEGATIVE TONE DEVELOPER COMPATIBLE PHOTORESIST COMPOSITION AND METHODS OF USE

CROSS REFERENCE TO RELATED APPLICATIONS

The present application claims the benefit of U.S. Provisional Patent Application No. 62/021,756, filed on Jul. 8, 2014, entitled "Negative Tone Developer Compatible Photoresist Composition and Methods of Use," which is incorporated herein by reference in its entirety.

BACKGROUND OF THE INVENTION

Techniques disclosed herein relate to microfabrication, and relate in particular to photolithography.

In material processing methodologies (such as photolithography), creating patterned layers typically involves the application of a thin layer of radiation-sensitive material, such as photoresist, to a surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithographic system. This exposure creates a latent pattern within the radiation-sensitive material which can then be developed. Developing refers to dissolving and removing a portion of the radiation-sensitive material to yield a topographic or physical pattern. For example, developing can include removal of irradiated regions of the radiation-sensitive material (as in the case of positive photoresist), or non-irradiated regions (as in the case of negative resist) using a developing solvent. The topographic pattern can then function as a mask layer for subsequent processing.

SUMMARY

"Resist" compositions and films, as used in the microfabrication industry, generally refer to materials that resist an etch process. This includes resistance to wet etch processes, and also to plasma-based dry etch processes. Such films are commonly described as photoresists because of their ability to have a solubility shift in response to exposure to a particular radiation wavelength or wavelengths.

Current photolithography trends include using negative tone developer compatible photoresists. Such photoresists are positive tone photoresists but are developed using a negative tone development technique. A conventional positive tone photoresist responds to actinic radiation by de-protecting exposed regions to a developing solvent. In other words, portions of a positive tone photoresist exposed to radiation have a solubility shift in which solubility is increased to a positive tone developer. With negative tone development, however, a positive photo resist is used, but it is the unexposed (protected region) that is dissolved by negative tone developer solvents. There are advantages to using negative tone development schemes. Nevertheless relief patterns and lines created using a negative tone development scheme can have an undesirable line edge or line width roughness. This roughness can then limit subsequent pattern transfer and microfabrication processes.

Techniques disclosed herein include negative tone developer compatible compositions and methods of using such compositions. This includes a positive tone photoresist that can be developed using negative tone developers in that unexposed portions of the positive tone photoresist are dissolvable by one or more negative tone developer solvents. One embodiment includes a negative tone developer compatible photoresist with little or no etch resistance. In other words, compositions can include a non-resistive photoresist that is compatible with negative tone development. Non-resistive photoresist materials as described herein include one or more radiation-sensitive attributes (for example, the photoresist can be patterned, de-protected, solubility shifted, interact with photo chemistries, and respond to exposure doses), except that these materials have effectively no etch resistance. In the context of microfabrication, such a composition runs counter to conventional and historical photolithography practices because the purpose of a resist is to provide a patterned mask that can be used to transfer a pattern into an underlying layer by etching the underlying layer. For example, if a relief pattern using such a non-resistive photoresist was subjected to a given etch process immediately after developing the relief pattern, then the relief pattern will be quickly etched away or etched away prior to etch transfer of the relief pattern into an underlying layer. Nevertheless, such a non-resistive positive tone photoresist that is compatible with negative tone development is beneficial, and is particularly beneficial to microfabrication processes.

Compositions described herein can be used with methods described herein that include one or more post-development techniques. Techniques herein can include various types of image reversal techniques in which a given relief pattern is reversed prior to etch transfer. Techniques herein can also include various types of photoresist strengthening techniques that create etch resistivity after photoresist development.

Negative tone developer compatible photoresists having substantially no etch resistivity, as disclosed herein, provide various benefits. Positive tone photoresists that are negative tone developer compatible conventionally include one or more components that provide or promote etch resistivity. For example, such additives can include cage groups, adamantyl groups, lactone groups, or other additives that provides etch resistance. By removing these etch resistive components, a more cost-efficient photoresist can be generated. Moreover, these resistive components typically add bulk to a given photoresist and can be responsible for increasing edge or surface roughness. Without etch-resistive groups included, a given positive tone photoresist can have a roughness reduction of up to one nanometer or more.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 3A-3E are cross-sectional schematic views of an example substrate segment showing a process flow according to embodiments disclosed herein.

DETAILED DESCRIPTION

Figure 1A:
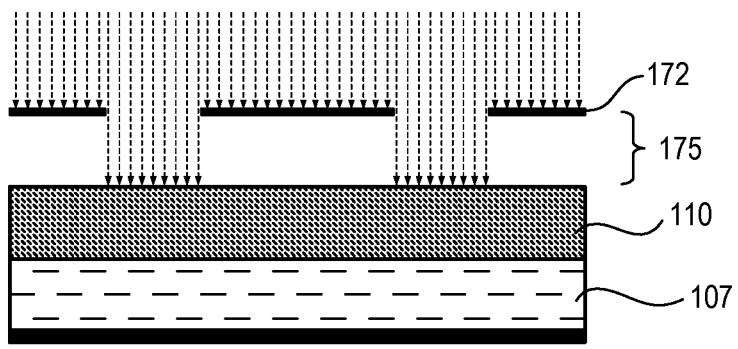
FIGS. 1A-1E are cross-sectional schematic views of an example substrate segment showing a process flow according to embodiments disclosed herein.

Techniques disclosed herein include negative tone developer compatible compositions and methods of using such compositions. This includes a positive tone photoresist that can be developed using negative tone developers in that unexposed portions of the positive tone photoresist are dissolvable by one or more negative tone developer solvents. One embodiment includes a negative tone developer compatible photoresist with little or no etch resistance. In other words, compositions can include a non-resistive photoresist that is compatible with negative tone development. Non-resistive photoresist materials as described herein include one or more radiation-sensitive attributes (for example, the photoresist can be patterned, de-protected, solubility shifted, interact with photo chemistries, and respond to exposure doses), except that these materials have effectively no etch resistance.

One example embodiment includes a positive tone photoresist that is negative tone developer compatible, and that is substantially or effectively free from components, functional groups, or additives that provide or increase etch resistivity to a wet or dry etch process. A positive tone photoresist is a photoresist that, in response to exposure to radiation, increases its solubility to one or more positive tone developers. In other words, regions that are exposed to light become de-protected to a positive tone developer such that a positive tone developer can dissolve exposed portions. A negative tone developer is a developer chemistry that dissolves un-exposed portions of a given positive tone photoresist film. Thus, as used herein, a negative tone developer compatible photoresist is a positive tone photoresist that is formulated to have a solubility shift in response to exposure to actinic radiation (usually at a particular light wavelength) such that exposed portions become insoluble to a negative tone developer and un-exposed portions remain soluble to a negative tone developer. The exposed portions can become soluble to a positive tone developer chemistry.

Positive tone developer chemistries have been conventionally used. Developing a pattern using positive tone development (PTD) involves removing an exposed region of a latent pattern in a photoresist film by the action of an aqueous base developer such as aqueous tetramethylammonium hydroxide (TMAH). An exemplary positive tone developer is 0.26 N TMAH (aq.). Alternatively, the same latent pattern in the photoresist film can be developed using an organic solvent developer to provide negative tone development (NTD) in which the unexposed region of the latent pattern is removed by the action of a negative tone developer. Useful solvents for negative tone development include those also useful for dissolving, dispensing, and coating. Exemplary negative tone developer solvents include methyl 2-hydroxybutyrate (HBM), propylene glycol monomethyl ether acetate (PGMEA), methoxyethoxypropionate, ethoxyethoxypropionate, and gamma-butyrolactone, cyclohexanone, 2-heptanone, and a combination comprising at least one of the foregoing solvents.

Another embodiment can include a positive tone photoresist composition comprising a polymer component. A resin component can be included, and this resin component can be selected to exhibit increased alkali solubility under action of acid. An acid generator component can be included that generates acid in response to exposure to actinic radiation (photo acid generator). The composition can also include an organic solvent. The organic solvent can facilitate dispensing and spin casting onto a substrate. The organic solvent can be baked out to help create a functional layer of photoresist. The positive tone photoresist composition is substantially free (or entirely free) from functional groups that increase etch resistivity.

Another embodiment can include a photoresist composition comprising one or more polymer components, one or more resin components, one or more photo acid generator compounds that generate photo acid in response to exposure to a predetermined wavelength of light, and one or more solubility-changing groups that react to generated photo acid by making polymer components insoluble to a negative tone developer. This photoresist composition has approximately no etch resistivity to dry or wet etch processes.

Another embodiment includes a photoresist composition comprising one or more resin components that exhibit a change in solubility under action of acid, one or more photo acid generator compounds that generate photo acid in response to exposure to radiation, and one or more solubility changing groups that react to generated photo acid by making the polymer components insoluble to a negative tone developer. This photoresist composition has approximately no etch resistivity to dry or wet etch processes such as plasma-based etching chemistries.

One embodiment includes a photoresist composition comprising a positive tone resist polymer component, a resin component, an acid generator component that generates acid in response to exposure to actinic radiation, a solvent, and a solubility-shifting component that causes regions of the photoresist composition exposed to actinic radiation to become soluble to a positive tone developer. This composition is formulated such that regions unexposed to actinic radiation remain soluble to a negative tone developer. This photoresist composition is also formulated such that an amount of functional groups, included in the photoresist composition, that increase etch resistance, to a wet etch or dry etch process, ranges from 0.0% to 15% by weight based on a total weight of solid content in the photoresist composition. Thus, there can either be no such functional groups included in the composition, or an amount too small to provide any effective etch resistance. In other embodiments such etch-resistance promoting functional groups are less than 10% or less than 5% by weight based on a total weight of solid content. In other words, an amount of etch-resistance promoting additives or components is sufficiently low to provide substantially no etch-resistance, especially as compared to etch-resistance of target layer to be etched.

Another embodiment is a photoresist composition that includes a photoresist polymer component, a resin component, an acid generator component that generates acid in response to exposure to actinic radiation, a solvent, and a solubility shifting component that causes regions of the photoresist composition exposed to actinic radiation to become soluble to a positive tone developer, wherein regions unexposed to actinic radiation remain soluble to a negative tone developer. An amount of functional groups, included in the photoresist polymer component that increase etch resistance to a wet etch or dry etch process, ranges from 0.0% to 15% by weight based on a total weight of the photoresist polymer component. In other embodiments the amount of functional groups, included in the photoresist polymer component that increase etch resistance to a wet etch or dry etch process, is less than 10% or 5%.

One embodiment includes a photoresist composition comprising a positive tone resist polymer component, a resin component, an acid generator component that generates acid in response to exposure to actinic radiation, a solvent, and a solubility-shifting component that causes regions of the photoresist composition exposed to actinic radiation to become soluble to a positive tone developer. This composition is formulated such that regions unexposed to actinic radiation remain soluble to a negative tone developer. This photoresist composition is formulated such that the photoresist composition (or film made from the photoresist composition) has an Ohnishi parameter value greater than approximately 3.0. In other embodiments the Ohnishi parameter value can be greater than 4.0 or even 2.7.

Another embodiment includes a photoresist composition comprising a polymer that includes a structural unit, a radiation-sensitive acid generator that generates acid upon exposure to light, an acid-labile group that shifts solubility of the polymer in response to presence of acid, the polymer being compatible with a negative tone developer such that unexposed regions of the polymer are soluble in the presence of a negative tone developer. The acid-labile groups are selected to cause exposed regions of the polymer to become insoluble to a negative tone developer. This photoresist composition has an Ohnishi parameter value greater than approximately 3.0.

Another embodiment includes a photoresist composition comprising a positive tone photoresist component that is soluble to an organic solvent. The positive tone photoresist component can include a polymer and/or resin. The photoresist also comprises a radiation-sensitive acid generator that generates photo acid in response to exposure to a predetermined wavelength of light, and a solubility-shifting component that, in response to the presence of photo acid, causes the positive tone photoresist component to become insoluble to an organic solvent developer, wherein the photoresist composition is formulated such that, when formed into a layer of photoresist, the layer of photoresist has an Ohnishi parameter greater than 3.0. In other embodiments, the positive tone photoresist component comprises a polymer or a resin and polymer The so-called Ohnishi parameter is a measure of a given material's etch resistance. Wet or dry etching resistance can be estimated by the Ohnishi parameter of a resist composition. The Ohnishi parameter can be defined as: $(N/(Nc-No))$, where N expresses the total number of atoms, Nc expresses the number of carbon atoms, and No expresses the number of oxygen atoms. Thus, a photoresist with high carbon content acts as a better etch mask than does a photoresist with high oxygen content under oxygen plasma reactive ion etching (RIE). Excellent dry etching ability is obtained when the Ohnishi parameter is small. For example, a resist composition having an Ohnishi parameter that is equal to or less than 4.0 has good etch resistance, with values less than 2.5 highly desirable for etch resistance. For example, a high carbon content polymer, such as poly(hydroxy-styrene), has an Ohnishi parameter (etch rate) of about 2.5, while an oxygen-containing polymer such as poly(methylmethacrylate) has an Ohnishi parameter of about 5.0. Any ring structures present can also contribute to a high etch resistance. Thus, materials with an Ohnishi parameter of about 3.0 and greater have little or no etch resistance.

Another example embodiment includes a photoresist composition that includes a photoresist polymer component, a resin component, an acid generator component that generates acid in response to exposure to actinic radiation, a solvent, and a solubility-shifting component that causes regions of the photoresist composition exposed to actinic radiation to become soluble to a positive tone developer, and such that regions unexposed to actinic radiation remain soluble to a negative tone developer. This photoresist composition, when deposited on a substrate as a photoresist film, provides an etch resistivity such that a given plasma-based etching process etches the photoresist film at a greater etch rate than the given plasma-based etching process etches a material selected from the group consisting of silicon dioxide, silicon, polycrystalline silicon, silicon nitride, tetraethyl orthosilicate, amorphous carbon, and silicon oxynitride. This photoresist film can have an etch resistivity less than other materials conventionally patterned using photoresist masks.

Another embodiment includes a positive tone photoresist composition comprising a positive tone resist polymer component, a resin component, an acid generator component that generates acid in response to exposure to actinic radiation, a solvent, and a solubility-shifting component that causes regions of the positive tone photoresist composition exposed to actinic radiation to become soluble to a positive tone developer. This composition is formulated such that regions unexposed to actinic radiation remain soluble to a negative tone developer. This positive tone photoresist composition is free or substantially free from functional groups that increase etch resistance to a wet or dry etch process.

Another embodiment includes a photoresist composition comprising one or more polymer components, one or more resin components, one or more photo acid generator compounds that generate photo acid in response to exposure to a predetermined wavelength of light, and one or more solubility changing groups that react to generated photo acid by making the polymer components insoluble to a negative tone developer, wherein the photoresist composition has substantially no etch resistivity to dry or wet etch processes. One embodiment includes a photoresist composition that includes a negative tone developer compatible photoresist that is substantially free from functional groups that increase etch resistivity to a wet or dry etch process.

One embodiment includes a photoresist composition comprising one or more resin components that exhibit a change in solubility under action of acid, one or more photo acid generator compounds that generate photo acid in response to exposure to a radiation, and one or more solubility changing groups that react to generated photo acid by making the polymer components insoluble to a negative tone developer. This photoresist composition has substantially no etch resistivity to dry or wet etch processes. Other embodiments include a photoresist composition that comprises a positive tone photoresist component that is soluble to an organic solvent, a radiation-sensitive acid generator that generates photo acid in response to exposure to a predetermined wavelength of light, a solubility-shifting component that, in response to the presence of photo acid, causes the positive tone photoresist component to become insoluble to an organic solvent developer, and that is substantially free of cage groups, adamantyl groups, lactone groups, ligand groups, or other additives primarily designed (or that primarily function) to promote etch resistance.

Another embodiment includes a positive tone photoresist composition comprising a polymer component, a resin component that exhibits increased alkali solubility under action of acid, an acid generator component that generates acid in response to exposure to actinic radiation, and an organic solvent. The positive tone photoresist composition is substantially free from functional groups that increase etch resistivity. Another photoresist composition comprises (a) a polymer, (b) a resin, (c) de-protection group, (d) a solvent, and (e) a photoacid generator, wherein the photoacid generator generates acid upon exposure to radiation, wherein the de-protection group responds to acid presence by changing solubility of the polymer so that the polymer is insoluble to negative tone develop solvents, and wherein the photoresist is substantially free from constituents that provide etch resistance to an etching process. Another photoresist composition comprises a positive tone photoresist with the positive tone photoresist being soluble to a negative tone developer. The negative tone photoresist is formulated such that exposure to lithographic radiation causes exposed portions (through a photomask) of the positive tone photoresist to become insoluble to a negative tone developer. This positive tone photoresist is free from components that provide etch resistance to a wet etch process or to a dry etch process.

Another embodiment can include a photoresist composition comprising one or more polymer components, one or more resin components, one or more photo acid generator compounds that generate photo acid in response to exposure to a predetermined wavelength of light, and one or more solubility-changing groups that react to generate photo acid by making polymer components insoluble to a negative tone developer. This photoresist composition has approximately no etch resistivity to dry or wet etch processes.

Another embodiment includes a photoresist composition comprising one or more resin components that exhibit a change in solubility under action of acid, one or more photo acid generator compounds that generate photo acid in response to exposure to radiation, and one or more solubility changing groups that react to generate photo acid by making the polymer components insoluble to a negative tone developer. This photoresist composition has approximately no etch resistivity to dry or wet etch processes.

Note that the above compositions can be formulated as a fluid that is spin castable such as to form a photoresist film on a substrate or wafer. One or more of the compositions can be formulated to be substantially free from cage groups, adamantyl groups, lactone groups, and/or ligand groups. Sensitizers can be included in compositions for increasing a sensitivity of the resist material to the lithographic radiation. Selections for polymer components, resin components, acid generators, solvents, and solubility-shifting components can be selected from conventionally available chemistries based on a given design or patterning specifications to formulate a photoresist that is negative tone developer compatible without providing substantial or effective etch resistance. For example, an etch resistance that is less than or about equal to an etch resistance of a particular underlying layer to be etched would be ineffective. Conventionally, photoresist films provide an etch resistance many times greater than a given target layer to be etched.

Photoresist compositions as disclosed herein can be beneficial for use in photolithography applications. For example, compositions herein can be used for patterning applications. One example method of making a pattern includes exposing a photoresist composition layer (a photoresist film) with a pattern of actinic radiation (typically of one or more predetermined wavelengths of light) and developing the pattern by treatment with an organic solvent developer (negative tone developer) to form a negative tone relief image, that is, a topographically patterned layer of photoresist. Note, however, that this topographically patterned layer of photoresist (immediately after this development step) is free from components designed to provide or promote etch resistance. The advantage of a photoresist lacking functional groups that provide etch resistance is that a patterned photoresist has very smooth lines. One drawback of functional groups that provide etch resistance is that these additives are relatively bulky and increase surface roughness of a developed photoresist. The result of patterning with photoresists disclosed herein is creating a relief pattern resist layer with very low line edge roughness or line width roughness. This particular relief pattern, however, cannot be transferred into an underlying layer via conventional etch techniques because the photoresist layer provides little or no etch resistance.

Other techniques herein include methods of using any of the above-described compositions, including use in patterning methods. These methods generally include forming a film from such compositions, and then lithographically patterning the film to create a relief or topographic pattern. For example, a pattern forming method can include forming a photoresist film by depositing a photoresist composition on a substrate. The photoresist composition can include any of the above-described compositions. For example, this can include a positive tone photoresist component that is soluble to an organic solvent, a radiation-sensitive acid generator that generates photo acid in response to exposure to a predetermined wavelength of light, and a solubility-shifting component that, in response to the presence of photo acid, causes the positive tone photoresist component to become insoluble to an organic solvent developer. This photoresist film is exposed to lithographic radiation, such as by using a scanner or stepper tool. Then the photoresist film is developed using negative tone development such that unexposed portions of the photoresist film are dissolved by an organic solvent developer (or other negative tone developer) resulting in a topographic patterned photoresist film, wherein the topographic patterned photoresist film has an Ohnishi parameter value greater than 3.0.

In other embodiments, an amount of functional groups included in the photoresist composition or resist film that increase etch resistance to a wet etch or dry etch process, ranges from 0.0% to 15% by weight based on a total weight of solid content in the photoresist composition. In other embodiments, the photoresist composition, when deposited on a substrate as a photoresist film, provides an etch resistivity such that a given plasma-based etching process etches the photoresist film at a greater etch rate than the given plasma-based etching process etches a material selected from the group consisting of silicon dioxide, silicon, polycrystalline silicon, silicon nitride, tetraethyl orthosilicate, amorphous carbon, and silicon oxynitride. In other words, the photoresist film has or provides an etch resistance less than that of an underlying target layer or memorization layer (sacrificial transfer layer).

Other embodiments include creating or increasing etch resistivity of the topographic patterned photoresist film after developing the photoresist film using one or more post-processing techniques. One advantage of developing latent patterns using compositions herein is substantially reduced surface roughness or line edge/line width roughness, primarily because of a lack of resist-promoting additives. Such compositions herein, however, run counter to conventional practices because relief pattern films herein would be ineffective functioning as an etch mask.

Techniques herein also include post-processing techniques (post-development techniques) for transferring patterns into one or more underlying layers. One type of post-processing technique involves physically or chemically strengthening the topographically patterned photoresist layer prior to etch transfer. Another type of post-processing technique involves multiple different methods for reversing the topographically patterned photoresist layer prior to etch transfer.

One technique for strengthening a patterned photoresist layer includes an exposure to ballistic electrons. Such a treatment can occur in a plasma processing chamber that includes an upper electrode. A substrate having a film of photoresist as disclosed herein is mounted on a substrate holder of a plasma processing chamber such as a capacitively-coupled plasma processing chamber. In this chamber the upper electrode has a silicon or silicon oxide coating or plate. A plasma is generated in the processing chamber using radiofrequency power transmitted to either the upper electrode or the lower electrode. Negative voltage direct current is then coupled to the upper electrode. This negative charge in the upper electrode attracts positively charged ions which strike the upper electrode ejecting silicon and electrons. Due to the negative voltage present, the electrons are accelerated towards the substrate. These electrons striking the photoresist layer cause one or more polymers within the photoresist layer to become hardened or more etch resistant.

A thin layer of silicon can be simultaneously and conformally deposited on the photoresist layer via sputter deposition. This ballistic electrons treatment can be labeled as direct current superposition. After the photoresist layer has become sufficiently etch resistant by exposure to the ballistic electrons, a topographically patterned photoresist layer can then be directly transferred into an underlying layer via one or more etch processes. Such etch processes can include wet etch processes (hydrofluoric acid), or plasma-based dry etch processes using one or more mixtures of gases that can chemically and/or physically react with an underlying layer.

Figure 1B:
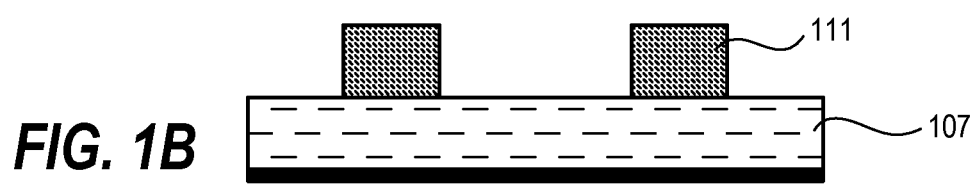
Figure 1C:
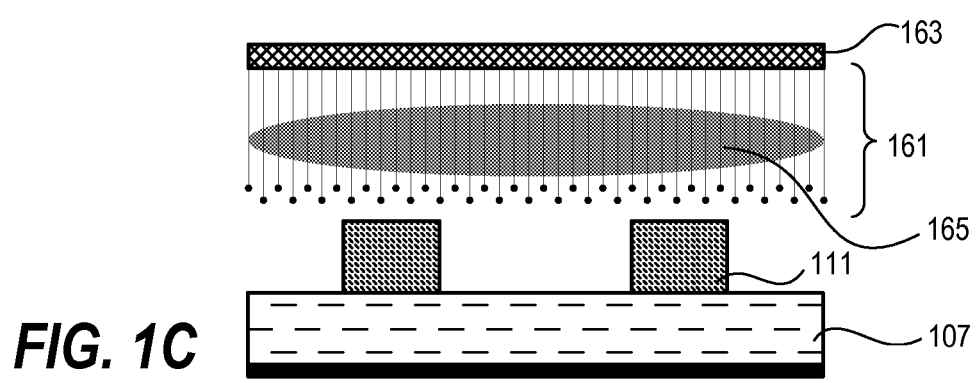
Figure 1D:
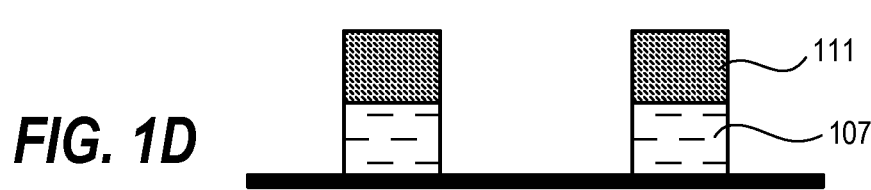
Figure 1E:
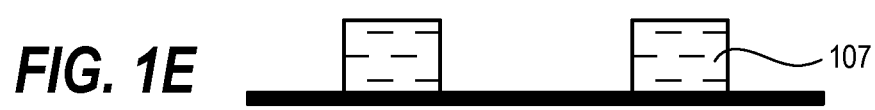

FIGS. 1A-1E show a schematic cross-section substrate segment of a photoresist strengthening process using ballistic electrons. In FIG. 1A a photoresist layer 110 or film is being exposed to a pattern of radiation (actinic radiation 175), such as by using a photomask 172. This layer or film is compatible with negative tone development. Photoresist layer 110 is positioned on target layer 107. Accordingly, developing a latent pattern in this photoresist layer results in removal of areas that were not exposed to radiation, as shown in FIG. 1B. Thus, photoresist layer 110 becomes relief pattern 111. FIG. 1C shows a substrate being exposed to ballistic electrons via a plasma processing chamber. Negative polarity direct current power is coupled to an upper electrode 163 of a plasma processing system. A flux of electrons 161 is accelerated from the upper electrode 163 with sufficient energy to pass through plasma 165 and strike the substrate such that an exposed surface of the relief pattern 111 changes in physical properties including becoming unresponsive to solubility shifts. In FIG. 1D an etch operation has been executed that transferred a pattern defined by the relief pattern 111 into a target layer 107 or other underlying layer. The photoresist material can then be completely removed resulting in a target layer on the substrate having been patterned as shown in FIG. 1D, resulting in a patterned underlying layer in FIG. 1E.

Figure 2A:
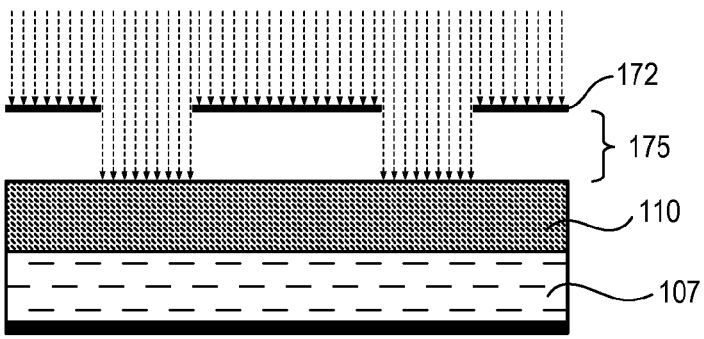
FIGS. 2A-2F are cross-sectional schematic views of an example substrate segment showing a process flow according to embodiments disclosed herein.
Figure 2B:
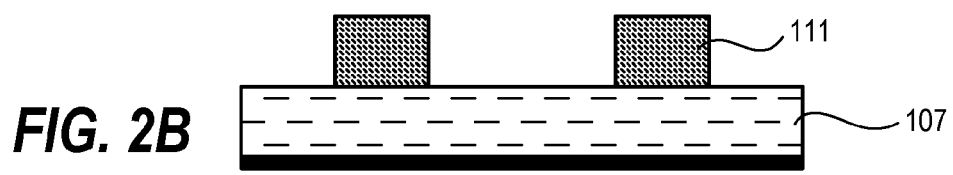
Figure 2C:
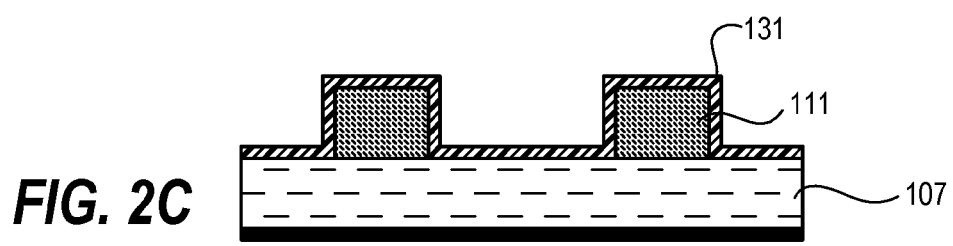
Figure 2D:
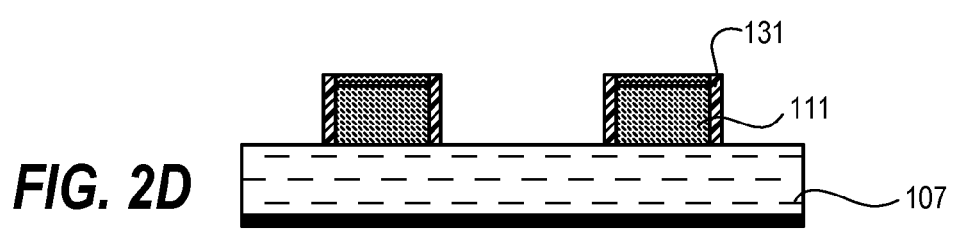
Figure 2E:
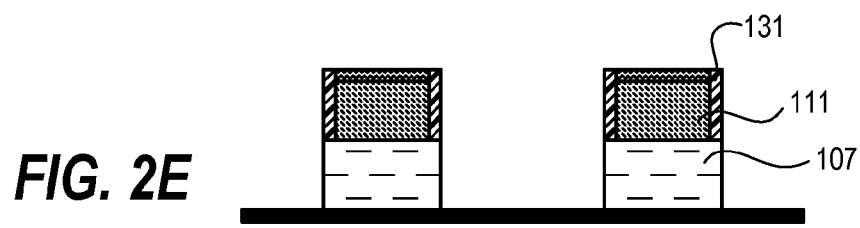
Figure 2F:

Another technique for increasing etch resistivity of a topographically patterned photoresist layer includes an atomic layer deposition process followed by an etch process. FIGS. 2A-2F illustrate this process generally. Note that in the Figures, FIGS. 2A and 2B are similar to FIGS. 1A and 1B. For example, one or more material layers are conformally deposited on the patterned photoresist layer via atomic layer deposition as shown by film 131 in FIG. 2C. Atomic layer deposition is a known deposition technique for depositing highly conformal layers, typically one layer of atoms or molecules at a time. With such a conformal layer on the patterned photoresist a conventional etch process (typically anisotropic) is executed. In areas where the conformal layer covers only an underlying layer, the etch process etches through the conformal layer and continues into the underlying layer. In areas where there is photoresist material, the conformal layer interacts with the photoresist material and the etch mechanism (e.g. tangling ligand groups) essentially hardens the photoresist material and provide etch resistance (FIG. 2D), thereby enabling pattern transfer (FIG. 2E) resulting in a patterned target layer shown in FIG. 2F.

Another embodiment herein includes a pattern reversal technique (FIGS. 3A-3E). This reversal technique can include depositing a conformal protection layer on the substrate such that this conformal protection layer covers exposed surfaces of the topographic patterned photoresist film as well as exposed surfaces of an underlying target layer. Note that FIGS. 3A and 3B are similar to FIGS. 1A and 1B. An example schematic depiction of this is shown in FIG. 3C. Next, a chemical-mechanical polishing (CMP) step is executed. This CMP step removes the topographically patterned photoresist film but leaves the conformal protection layer on the target layer as shown in FIG. 3D. Thus, beneficial selections for the conformal protection layer include materials that provide a good CMP stop layer and that are etch resistive relative to the underlying layer. By way of a non-limiting example, silicon nitride can be selected for use in the conformal protection layer. In this step, an abrasive pad can physically remove upright structures containing both photoresist and the conformal protection layer, while leaving the conformal protection layer on surfaces of the underlying substrate. With the photoresist layer essentially removed, an etch operation can transfer a pattern defined by the conformal protection layer into the underlying layer (FIG. 3E).

Figure 4A:
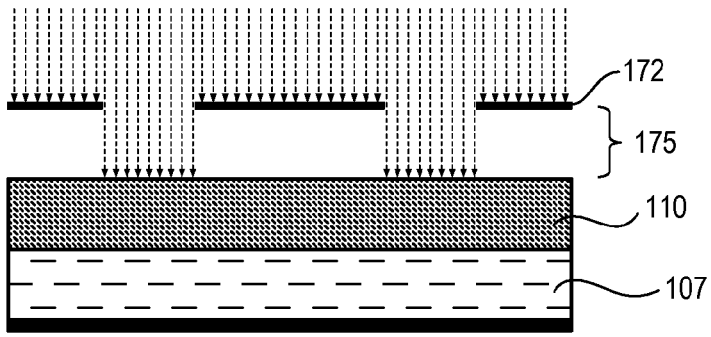
FIGS. 4A-4F are cross-sectional schematic views of an example substrate segment showing a process flow according to embodiments disclosed herein.
Figure 4B:
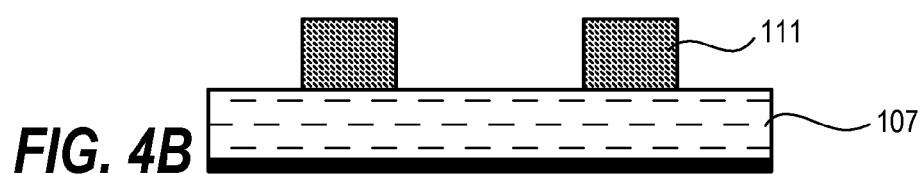
Figure 4C:
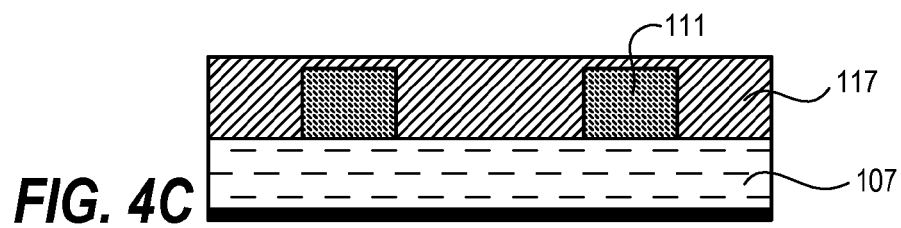
Figure 4D:
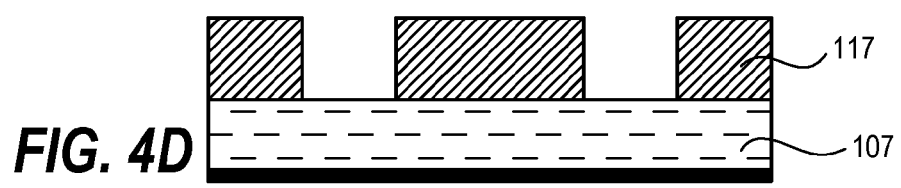
Figure 4E:
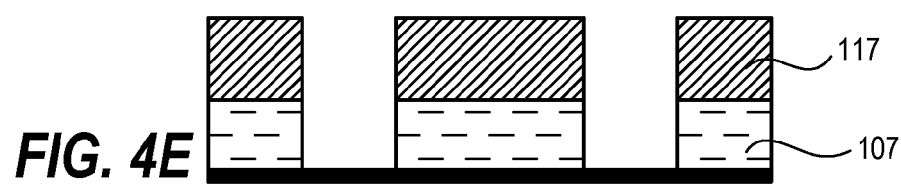
Figure 4F:
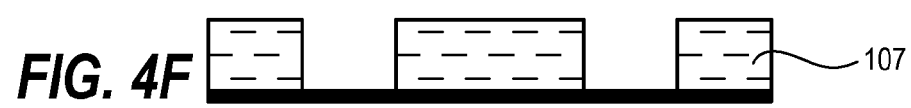

Another embodiment herein includes a pattern reversal technique. An example sequence for this technique is shown in FIGS. 4A-4F. Note that FIGS. 4A and 4B are similar to FIGS. 1A and 1B. Pattern reversal can include depositing a planarization layer 117 on a substrate such that the planarization layer fills openings defined by the topographically patterned photoresist film and at least covers exposed surfaces of an underlying target layer (FIG. 4C). Note that completely filling defined openings is not necessary, though in practice defined openings will usually be filled, with the photoresist film also being covered. This can be a typical deposition result when using a spin-on deposition technique for planarization layer material. Spin-on deposition would typically fill openings and cover the photoresist layer. This planarization layer can be an oxide layer, for example. The topographically patterned photoresist film is then removed while leaving the planarization layer (FIG. 4D). Such removal can be executed via an etch process. For example, a given chemistry is selected such as for plasma-based dry etching, and then the substrate is etched a predetermined distance or until the photoresist layer is uncovered. Upon uncovering the photoresist layer, this photoresist layer may be immediately etched away. With the photoresist layer removed, a pattern defined by the planarization layer is then transferred into an underlying layer via an etch process (FIGS. 4E-4F). This etch process could be different or identical chemistry to the etch process used to uncover the photoresist layer.

Figure 5A:
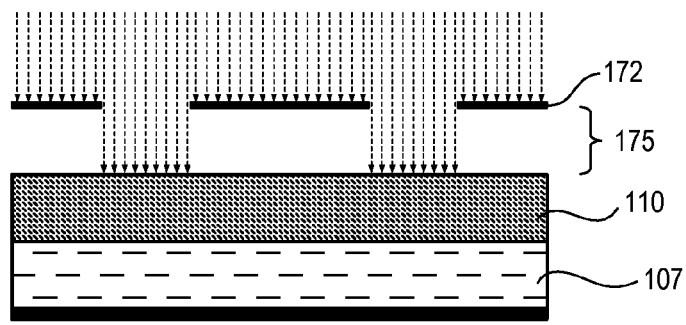
FIGS. 5A-5H and 5J are cross-sectional schematic views of an example substrate segment showing a process flow according to embodiments disclosed herein.
Figure 5B:
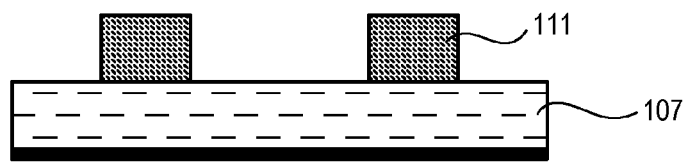
Figure 5C:
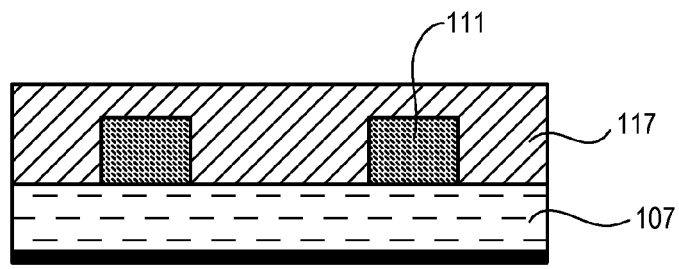
Figure 5D:
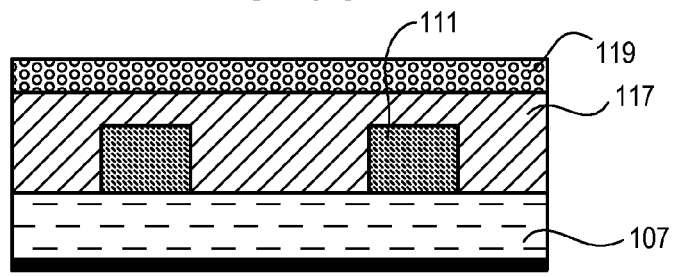
Figure 5E:
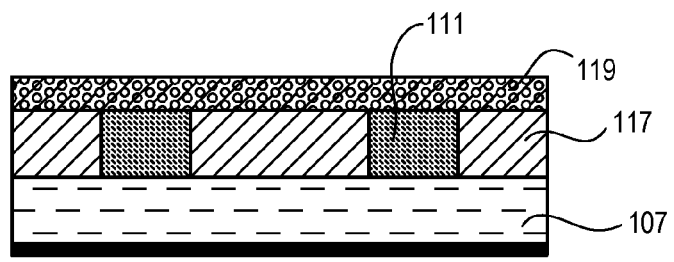
Figure 5F:
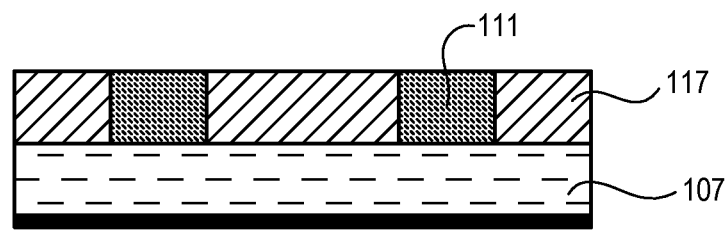
Figure 5G:
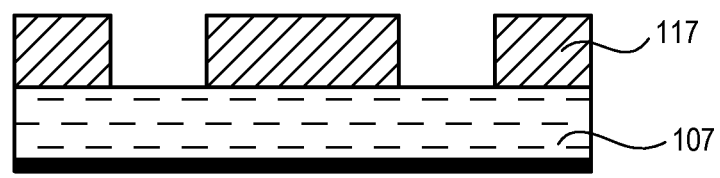
Figure 5H:
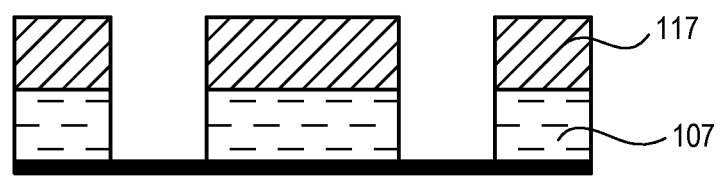
Figure 5J:
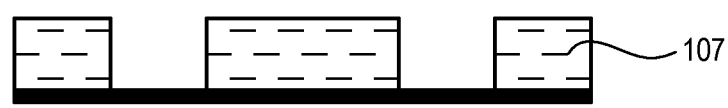

In another embodiment, a pattern reversal technique can be used based on acid diffusion as illustrated in FIGS. 5A-5H and 5J. Note that FIGS. 5A and 5B are similar to FIGS. 1A and 1B. The planarization layer 117 is deposited on the substrate such that the planarization layer fills openings defined by the relief pattern 111 and covers the relief pattern 111. In this embodiment, a material selected as the planarization layer is a material capable of having a solubility shift. Example material is another photoresist material. This photoresist material can have etch resistive properties. FIG. 5C shows an example result of an overcoat of planarization layer material. Next, an acid 119 can be deposited on the planarization layer as shown in FIG. 5D. The acid 119 is then diffused into an upper portion of the planarization layer 117. This upper portion extends from a top surface of the planarization layer to a top surface of the relief pattern 111. The acid diffusing into the planarization layer causes the upper portion of the planarization layer to become soluble to a predetermined solvent. FIG. 5E shows an upper portion of the planarization layer having become soluble to the predetermined solvent. The upper portion of the planarization layer is then removed using the predetermined solvent, with the result illustrated in FIG. 5F. Note in this illustration that the relief pattern 111 has been uncovered. The relief pattern 111 is then removed while leaving the planarization layer 117 (FIG. 5G). Removal can be accomplished using an etch process. The topographically patterned photoresist film does not include functional groups that provide etch resistance, whereas the planarization layer (which could also be a photoresist) can be etch resistive. A pattern defined by the planarization layer can be transferred into the underlying layer via an etch process (FIGS. 5H and 5J).

Figure 6A:
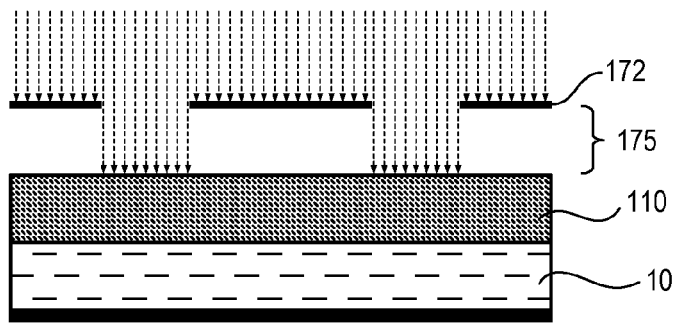
FIGS. 6A-6G are cross-sectional schematic views of an example substrate segment showing a process flow according to embodiments disclosed herein.
Figure 6B:
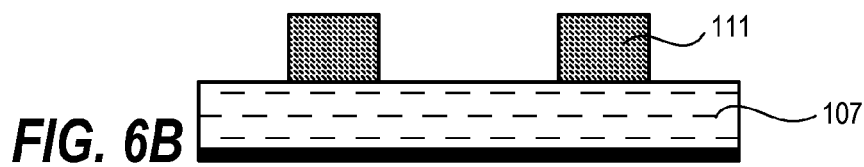
Figure 6C:
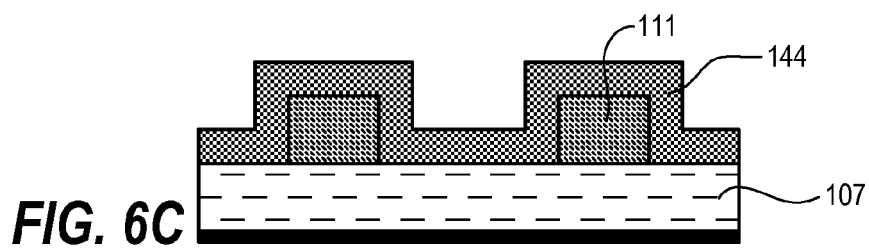
Figure 6D:
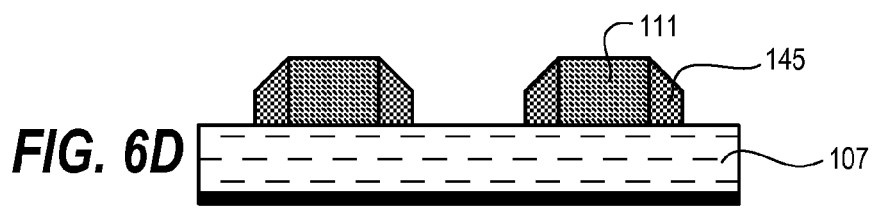
Figure 6E:
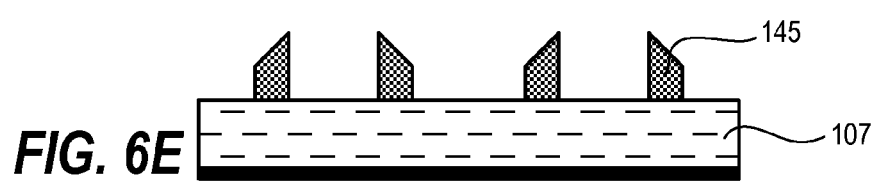
Figure 6F:
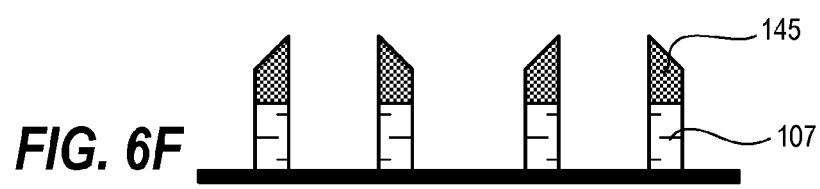
Figure 6G:
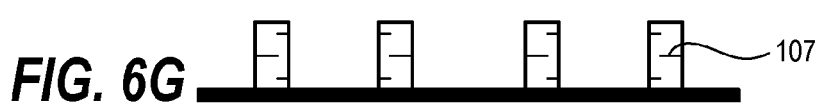

Another technique for using a non-resistive photoresist layer is to reverse a patterned photoresist using a self-aligned double patterning technique. An example process sequence in shown in FIGS. 6A-6G. Note that FIGS. 6A and 6B are similar to FIGS. 1A and 1B. Self-aligned double patterning in general is known. In this technique a conformal film 144 or semi-conformal film is deposited on the relief pattern 111 and covers the relief pattern 111 (FIG. 6C). An anisotropic etch process is executed so as to remove the conformal film from horizontal surfaces on the substrate leaving sidewall spacers 145 on sidewalls of the relief pattern 111 (FIG. 6D). With sidewall spacers 145 formed, the initial pattern has essentially been multiplied in density. If any of the topographically patterned photoresist remains after the etch process, the remainder can be removed using an ashing process or different etch process (FIG. 6E). The sidewall spacers remain on the target layer 107 can then be used as an etch mask to transfer a pattern into target layer 107 via an etch process (FIG. 6F), and then any remaining sidewall spacer material can be removed from the substrate (FIG. 6G).

Compositions and methods of use as disclosed herein can also help enable EUV (extreme ultraviolet) photolithography. In some EUV applications, conventional photoresist material does not perform as intended. When exposed to EUV radiation, such conventional resist materials are incapable of withstanding this radiation and either largely or entirely disappear. As a consequence, there is insufficient photoresist to be able to transfer a pattern and so having etch resistance within the photoresist film becomes inconsequential has discovered herein. With compositions as disclosed herein, removing functional groups (omitting inclusion of functional groups) that promote etch resistance, other functional groups can be added that can withstand EUV radiation.

Compositions and methods herein can also be used to remove defects associated with EUV exposure. For example, a non-resistive photoresist film can be exposed using an EUV photomask and then developed using a negative tone developer. This image can then be reversed using one or more techniques as previously described, and then a second layer of non-resistive photoresist film can be used with a same EUV photomask. With defects rarely if ever falling in a same place twice, by exposing the same EUV reticle again, defects can be eliminated.

Another challenge discovered with conventional photolithography is that resist films used for both conventional and EUV lithography are practically too thin to enable proper transfer. A trend with resist formulations is adding more cage groups and other functional groups that promote etch resistance but that result in greater line edge roughness. Additives that increase resistivity are not only bulky but also increase cost. Thus, compositions and methods herein can provide patterned resists that are both smoother and more cost-effective than conventional photoresists.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A pattern forming method, the method comprising:
    forming a photoresist film by depositing a photoresist composition on a substrate, the photoresist composition including a positive tone photoresist component that is soluble to an organic solvent, a radiation-sensitive acid generator that generates photo acid in response to exposure to a predetermined wavelength of light, and a solubility-shifting component that, in response to the presence of photo acid, causes the positive tone photoresist component to become insoluble to an organic solvent developer;
    exposing the photoresist film to lithographic radiation;
    developing the photoresist film using negative tone development such that unexposed portions of the photoresist film are dissolved by the organic solvent developer resulting in a topographic patterned photoresist film, wherein the topographic patterned photoresist film has an Ohnishi parameter value greater than 3.0;
    depositing a planarization layer on the substrate such that the planarization layer fills openings defined by the topographic patterned photoresist film and covers exposed surfaces of an underlying layer and covers the topographic patterned photoresist film;
    diffusing an acid into an upper portion of the planarization layer from a top surface of the planarization layer to a top surface of the topographic patterned photoresist film, the acid causing the upper portion of the planarization layer to become soluble to a predetermined solvent;
    removing the upper portion of the planarization layer using the predetermined solvent;
    removing the topographic patterned photoresist film while leaving the planarization layer; and
    transferring a pattern defined by the planarization layer into the underlying layer via an etch process.

2. The method of claim 1, wherein removing the topographic patterned photoresist film includes executing an etch process, the planarization layer being resistant to the etch process.

3. The method of claim 1, further comprising:
    depositing a semi-conformal or conformal film on the topographic patterned photoresist film that covers the topographic patterned photoresist film;
    executing an anisotropic etch process that removes the semi-conformal film from horizontal surfaces leaving sidewall spacers; and
    transferring a pattern defined by the sidewall spacers into the underlying layer via an etch process.

4. The method of claim 1, further comprising:
    increasing etch resistivity of the topographic patterned photoresist film after developing the photoresist film, wherein increasing etch resistivity includes exposing the topographic patterned photoresist film to a flux of electrons in a plasma chamber by applying negative voltage direct current to an upper electrode.

5. The method of claim 1, further comprising:
    increasing etch resistivity of the topographic patterned photoresist film after developing the photoresist film, wherein increasing etch resistivity includes depositing a conformal protection layer via atomic layer deposition.

6. A pattern forming method, the method comprising:
    forming a photoresist film by depositing a photoresist composition on a target layer of a substrate, the photoresist composition including a positive tone photoresist component that is soluble to an organic solvent, a radiation-sensitive acid generator that generates photo acid in response to exposure to a predetermined wavelength of light, and a solubility-shifting component that, in response to the presence of photo acid, causes the positive tone photoresist component to become insoluble to an organic solvent developer;
    exposing the photoresist film to lithographic radiation;
    developing the photoresist film using negative tone development such that unexposed portions of the photoresist film are dissolved by the organic solvent developer resulting in a topographic patterned photoresist film, wherein the topographic patterned photoresist film has an etch resistance less than the target layer;
    depositing a conformal protection layer on the substrate such that the conformal protection layer covers exposed surfaces of the topographic patterned photoresist film and exposed surfaces of the target layer;
    executing a chemical-mechanical polishing step that removes the topographic patterned photoresist film but that leaves the conformal protection layer on the target layer; and
    transferring a pattern defined by the conformal protection layer into the target layer via an etch process.

7. The method of claim 6, further comprising:
    increasing etch resistivity of the topographic patterned photoresist film after developing the photoresist film.

8. The method of claim 7, wherein increasing etch resistivity includes exposing the topographic patterned photoresist film to a flux of electrons in a plasma chamber by applying negative voltage direct current to an upper electrode.

9. The method of claim 7, wherein increasing etch resistivity includes depositing a conformal protection layer via atomic layer deposition.

10. A method of patterning a substrate, the method comprising:
    depositing a radiation-sensitive material on a substrate, the radiation-sensitive material being soluble to negative tone developer, the radiation-sensitive material having a de-protection group and a photo acid generator;
    exposing the radiation-sensitive material to a photolithographic pattern of radiation such that portions of the radiation-sensitive material being exposed to the photolithographic pattern of radiation become deprotected and soluble to a positive tone developer, the unexposed portions of the photolithographic pattern of radiation remaining soluble to a negative tone developer, and wherein the radiation sensitive material is substantially free of adamantyl groups and cage groups that provide etch resistance to an etching process; and developing the radiation-sensitive material using negative tone developer such that the radiation-sensitive material defines a patterned layer with portions of an underlying layer being uncovered; and increasing etch resistivity of the topographic patterned photoresist film after developing the photoresist film, wherein increasing etch resistivity includes exposing the topographic patterned photoresist film to a flux of electrons in a plasma chamber by applying negative voltage direct current to an upper electrode.

11. The method of claim 10, further comprising:

depositing a planarization layer on the substrate such that the planarization layer fills openings defined by the topographic patterned photoresist film and covers exposed surfaces of an underlying layer;

removing the topographic patterned photoresist film while leaving the planarization layer, wherein removing the topographic patterned photoresist film includes executing an etch process, the planarization layer being resistant to the etch process; and transferring a pattern defined by the planarization layer into the underlying layer via an etch process.

12. The method of claim 10, further comprising:

depositing a conformal protection layer on the substrate such that the conformal protection layer covers exposed surfaces of the topographic patterned photoresist film and exposed surfaces of an underlying layer;

executing a chemical-mechanical polishing step that removes the topographic patterned photoresist film but that leaves the conformal protection layer on the underlying layer; and transferring a pattern defined by the conformal protection layer into the underlying layer via an etch process.

* * * * *